(12) United States Patent
Hoshikawa

(10) Patent No.: US 12,707,616 B2
(45) Date of Patent: Aug. 11, 2026

(54) TAPE LOADING DEVICE

(71) Applicant: FUJI CORPORATION, Chiryu (JP)

(72) Inventor: Kazumi Hoshikawa, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 925 days.

(21) Appl. No.: 17/905,854

(22) PCT Filed: Mar. 31, 2020

(86) PCT No.: PCT/JP2020/014833
§ 371 (c)(1),
(2) Date: Sep. 8, 2022

(87) PCT Pub. No.: WO2021/199288
PCT Pub. Date: Oct. 7, 2021

(65) Prior Publication Data

US 2023/0121463 A1 Apr. 20, 2023

(51) Int. Cl.
*B23P 19/00* (2006.01)
*H05K 13/02* (2006.01)
*H05K 13/04* (2006.01)

(52) U.S. Cl.
CPC ....... *H05K 13/021* (2013.01); *H05K 13/0419* (2018.08)

(58) Field of Classification Search
CPC ............. H05K 13/021; H05K 13/0417; H05K 13/0419; H05K 13/086
See application file for complete search history.

(56) References Cited

U.S. PATENT DOCUMENTS 11,304,348 B2 * 4/2022 Matsushita .......... H05K 13/086
2018/0376630 A1 * 12/2018 Otsuki ............... H05K 13/0419
2021/0332969 A1 * 10/2021 Tajima ............. G05B 19/41805
2022/0347848 A1 * 11/2022 Nakayama ............. B25J 9/1674

FOREIGN PATENT DOCUMENTS

JP 2014-241344 A 12/2014
WO WO 2013/186848 A1 12/2013
WO WO 2014/097473 A1 6/2014
WO WO 2019/162984 A1 8/2019

OTHER PUBLICATIONS

International Search Report Issued Jul. 7, 2020, in PCT/JP2020/014833, filed on Mar. 31, 2020, 2 pages.

* cited by examiner

*Primary Examiner* — Paul D Kim
(74) *Attorney, Agent, or Firm* — Oblon, McClelland, Maier & Neustadt, L.L.P.

(57) ABSTRACT

A tape loading device includes a feeder holding stand configured to hold a feeder, an acquisition section configured to acquire identification information of the feeder held by the feeder holding stand and identification information of a reel on which a carrier tape accommodating multiple components is wound, a loading section configured to load the carrier tape unwound from the reel into the feeder, and a control device configured to control an operation of the loading section based on a determination result of whether the carrier tape is loadable into the feeder by a management device.

11 Claims, 5 Drawing Sheets

TAPE LOADING DEVICE

TECHNICAL FIELD

The present disclosure relates to a tape loading device.

BACKGROUND ART

A tape loading device is a device for automatically loading a carrier tape into a feeder for supplying a component in a component mounter for producing a board product (refer to Patent Literature 1). The loading of the carrier tape into the feeder is executed, for example, as part of a setup change before a mounting process by the component mounter is executed. At this time, a collation operation for collating identification information of the feeder and identification information of a reel on which the carrier tape is wound is executed so that an appropriate carrier tape is loaded on a feeder to be used in the mounting process.

PATENT LITERATURE

Patent Literature 1: WO 2013/132599

BRIEF SUMMARY

Technical Problem

Here, when executing the setup change, a large number of feeders and reels are placed around the tape loading device. In such a case, after it is determined that the respective identification information is suitable by the collation operation, when setting each of the feeder and the reel in the tape loading device, there is a possibility that either the feeder or the reel may be misrecognized. When the misrecognition of the feeder or the reel occurs, the carrier tape is loaded on the feeder in a state different from the combination used for the collation operation.

It is an object of the present description to provide a tape loading device capable of improving an accuracy of the loading of the carrier tape into the feeder and improving a loading efficiency.

Solution to Problem

The present description discloses a tape loading device including: a feeder holding stand configured to hold a feeder; an acquisition section configured to acquire identification information of the feeder held by the feeder holding stand and identification information of a reel on which a carrier tape accommodating multiple components is wound; a loading section configured to load the carrier tape unwound from the reel into the feeder; and a control device configured to be communicably connected to a management device configured to manage each of the feeder and the reel with the identification information, and to control an operation of the loading section based on a determination result of whether the carrier tape is loadable into the feeder by the management device.

Advantageous Effects

With such a configuration, since the feeder, which is an acquisition target of the identification information, is in a state of being held in a feeder holding stand, it is possible to prevent another carrier tape from being erroneously loaded in the feeder after acquiring a determination result as to whether the loading is permissible from a management device. As a result, the accuracy of the loading can be improved. In addition, since the tape loading device directly communicates with the management device, it is possible to improve the loading efficiency.

DESCRIPTION OF EMBODIMENTS

1. Outline of Tape Loading Device 10

Figure 1:
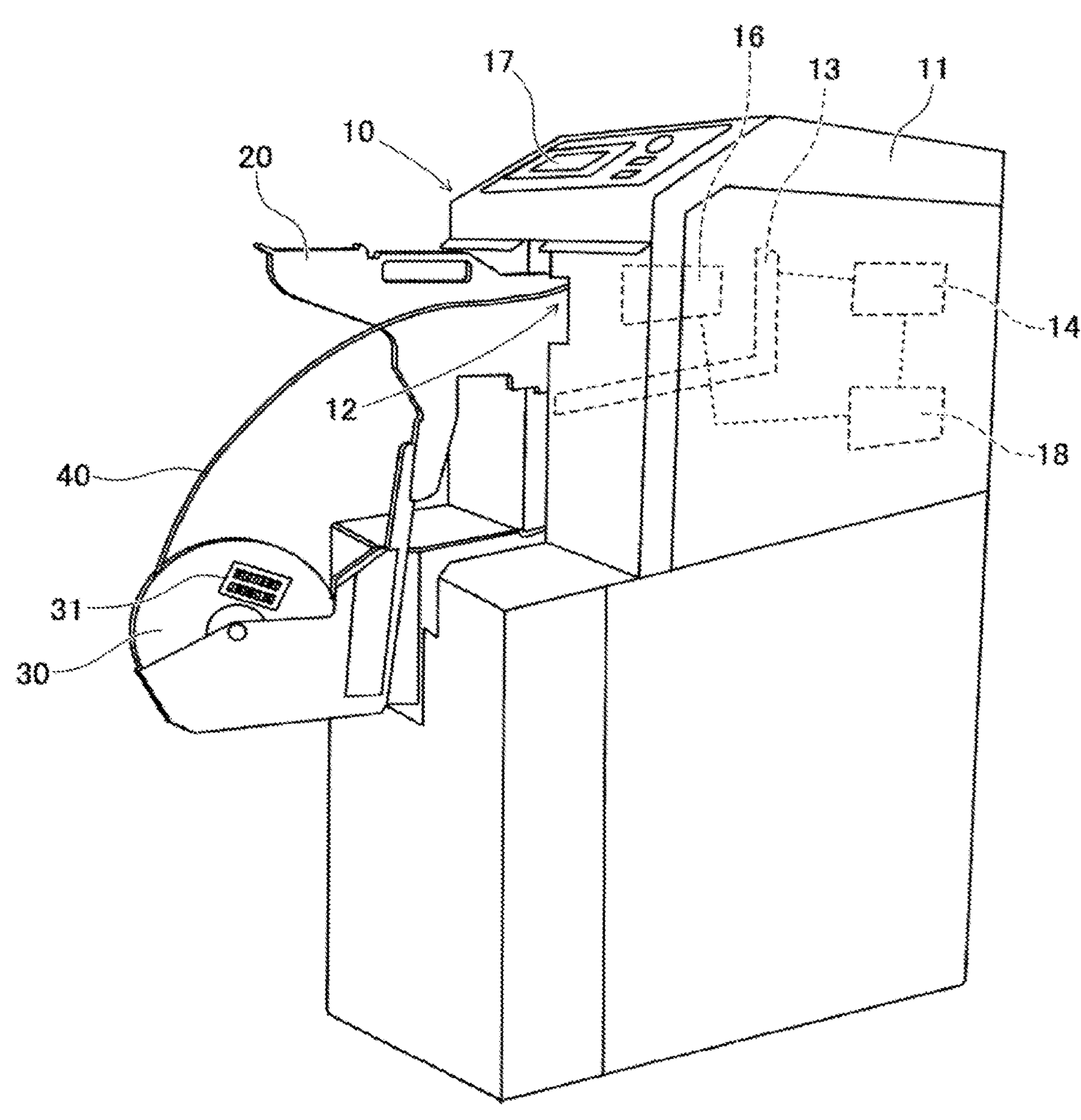
FIG. 1 is a perspective view illustrating an appearance of a tape loading device.

As illustrated in FIG. 1, tape loading device 10 sets feeder 20 and reel 30 and assists a loading of carrier tape 40 into feeder 20 or automatically loads carrier tape 40 into feeder 20. Feeder 20 is set in component mounter 71 and is used to supply component 51. Configurations of carrier tape 40 and feeder 20 will be described later. Tape loading device 10 is used, for example, for setup change before a mounting process of component 51 by component mounter 71 is executed. In order to load carrier tape 40 into feeder 20, it is required that appropriate carrier tape 40 is combined with feeder 20 used in the mounting process to be executed.

2. Configuration of Carrier Tape 40

Figure 2:
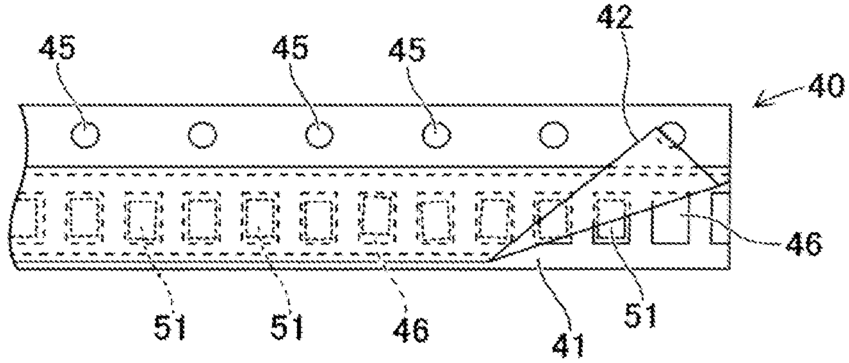
FIG. 2 is a plan view illustrating a carrier tape.

As illustrated in FIG. 2, carrier tape 40 includes base tape 41 and cover tape 42. Base tape 41 has multiple feeding holes 45 formed at equal intervals in a conveyance direction (longitudinal direction of the carrier tape) and multiple cavities 46 for accommodating component 51. Cover tape 42 is bonded to an upper surface of base tape 41 to close cavity 46. Hereinafter, the carrier tape will also be referred to, simply, as a "tape".

Tape 40 is stored in a state of being wound on reel 30. Code 31 indicating identification information unique to tape 40 (hereinafter, also referred to as a "reel ID") is attached to reel 30. Code 31 is, for example, a bar code or a 2D code. Tape 40 is managed by management device 60 such that reel information indicating a type of tape 40, a type, a remaining number, a use expiration date, a producer, or the like of component 51 to be accommodated are associated with the reel ID.

3. Configuration of Feeder 20

Feeder 20 is a tape feeder that is set in component mounter 71 and supplies component 51 accommodated in loaded tape 40 to supply position Ps. In supplying process of component 51, feeder 20 feeds and moves tape 40 unwound from reel 30 from insertion position Pi to supply position Ps (refer to FIG. 3). In the present embodiment, feeder 20 peels cover tape 42 from base tape 41 so that cavity 46 is opened at supply position Ps, and feeds and moves cover tape 42 along predetermined discharge path Te from peeling position Pp to discharge position Pe.

Figure 3:
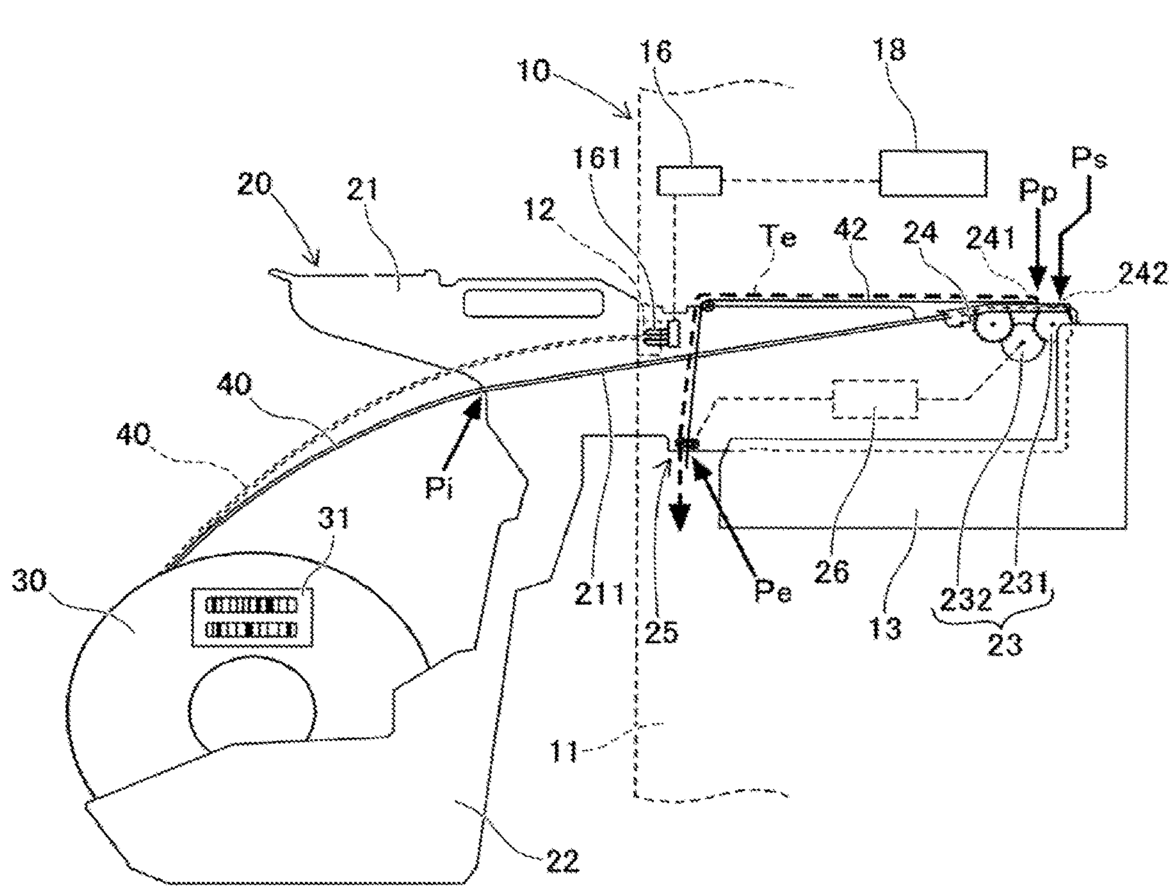
FIG. 3 is a side view illustrating a feeder and a reel.

Specifically, as illustrated in FIG. 3, feeder 20 includes feeder main body 21, reel accommodation section 22, feed driving section 23, tape guide 24, discharge device 25, and feeder control section 26. Feeder main body 21 is formed in a flat box shape. Tape conveyance path 211 for guiding tape 40 to be fed and moved from insertion position Pi to supply position Ps is formed in feeder main body 21. Reel accommodation section 22 accommodates reel 30 on which tape 40 is wound.

Feed driving section 23 pitch-feeds tape 40 pulled out from reel 30. Feed driving section 23 is disposed below tape conveyance path 211 at supply position Ps. Feed driving section 23 includes sprocket 231 and motor 232. Sprocket 231 is rotatably provided on feeder main body 21. External teeth of sprocket 231 engage with feeding hole 45 of tape 40. Motor 232 rotationally drives sprocket 231. In the present embodiment, motor 232 is a stepping motor, and outputs a driving force to sprocket 231 via a deceleration mechanism (not illustrated).

Tape guide 24 guides tape 40 above feed driving section 23. Tape guide 24 is attached to feeder main body 21. Peeling section 241 serving as a fulcrum when cover tape 42 peeled off from base tape 41 is pulled toward the rear of feeder 20 is formed on tape guide 24. Opening section 242 through which component 51 can be picked up from cavity 46 is formed on the upper surface of tape guide 24. A position of peeling section 241 and a position of opening section 242 in feeder 20 correspond to peeling position Pp and supply position Ps.

Discharge device 25 discharges cover tape 42 peeled off from base tape 41 to the outside. In the present embodiment, discharge device 25 operates in synchronization with feed driving section 23 to feed and move cover tape 42 peeled off from base tape 41 along predetermined discharge path Te from peeling position Pp to discharge position Pe. According to such a configuration, cover tape 42 is fed and moved to discharge position Pe, and is discharged toward below feeder 20.

In the present embodiment, a state in which tape 40 is loaded on feeder 20 is a state in which component 51 can be supplied at supply position Ps by driving of feed driving section 23. Specifically, a state in which tape 40 unwound from reel 30 extends from insertion position Pi to supply position Ps, and top tape 40 peeled off from base tape 41 can be discharged by driving of discharge device 25 is referred to as a loading state of tape 40. At this time, a part or all of the section from peeling position Pp to discharge position Pe may be a temporary tape connected to cover tape 42.

As the tape feeder, in addition to the type in which cover tape 42 is peeled off over the entire area in a width direction so as to separate cover tape 42 from base tape 41 as described above, there are a partial peeling type in which only a part of cover tape 42 in the width direction is peeled off, and a cutting type in which cover tape 42 is cut along the longitudinal direction. In the partial peeling type and the cutting type, cover tape 42 is bent at a position closer to insertion position Pi than supply position Ps so that cavity 46 is opened.

In addition, tape feeder includes an auto loading feeder that is provided with a feed driving section in the vicinity of insertion position Pi, and that automatically feeds and moves a starting end of tape 40 to supply position Ps when the starting end of tape 40 is inserted. In any type of feeder, the loading state of tape 40 is a state in which feeder feeds and moves tape 40 by its own function so that component 51 can be supplied to supply position Ps.

Feeder control section 26 controls operations of feed driving section 23 and discharge device 25. In a conveyance process for feeding and moving tape 40, feeder control section 26 executes control to rotate sprocket 231 by supplying power to motor 232 of feed driving section 23 and to convey tape 40 to a predetermined position. At this time, feeder control section 26 executes control that the operation of discharge device 25 to be synchronized with the operation of feed driving section 23.

When feeder 20 is set in an external device such as tape loading device 10 or component mounter 71, electric power is supplied from the external device through a connector. As a result, feeder control section 26 is in a state capable of communicating with the external device. Feeder control section 26 executes the conveyance process based on a control command by the external device or the like. In addition, feeder control section 26 sends identification information (hereinafter also referred to as a "feeder ID") unique to feeder 20 to the external device in response to a request from the external device.

4. Configuration of Tape Loading Device 10

As illustrated in FIG. 3, tape loading device 10 includes device main body 11 to be installed on a floor of a production facility or the like. Tape insertion port 12 into which the starting end of tape 40, which is a loading target, is inserted is formed in device main body 11. Tape loading device 10 includes feeder holding stand 13. Feeder holding stand 13 is provided at a center portion of device main body 11 in the width direction. Feeder holding stand 13 holds feeder 20 which is a target of the loading process. Feeder holding stand 13 is electrically connected to the connector of set feeder 20.

Figure 4:
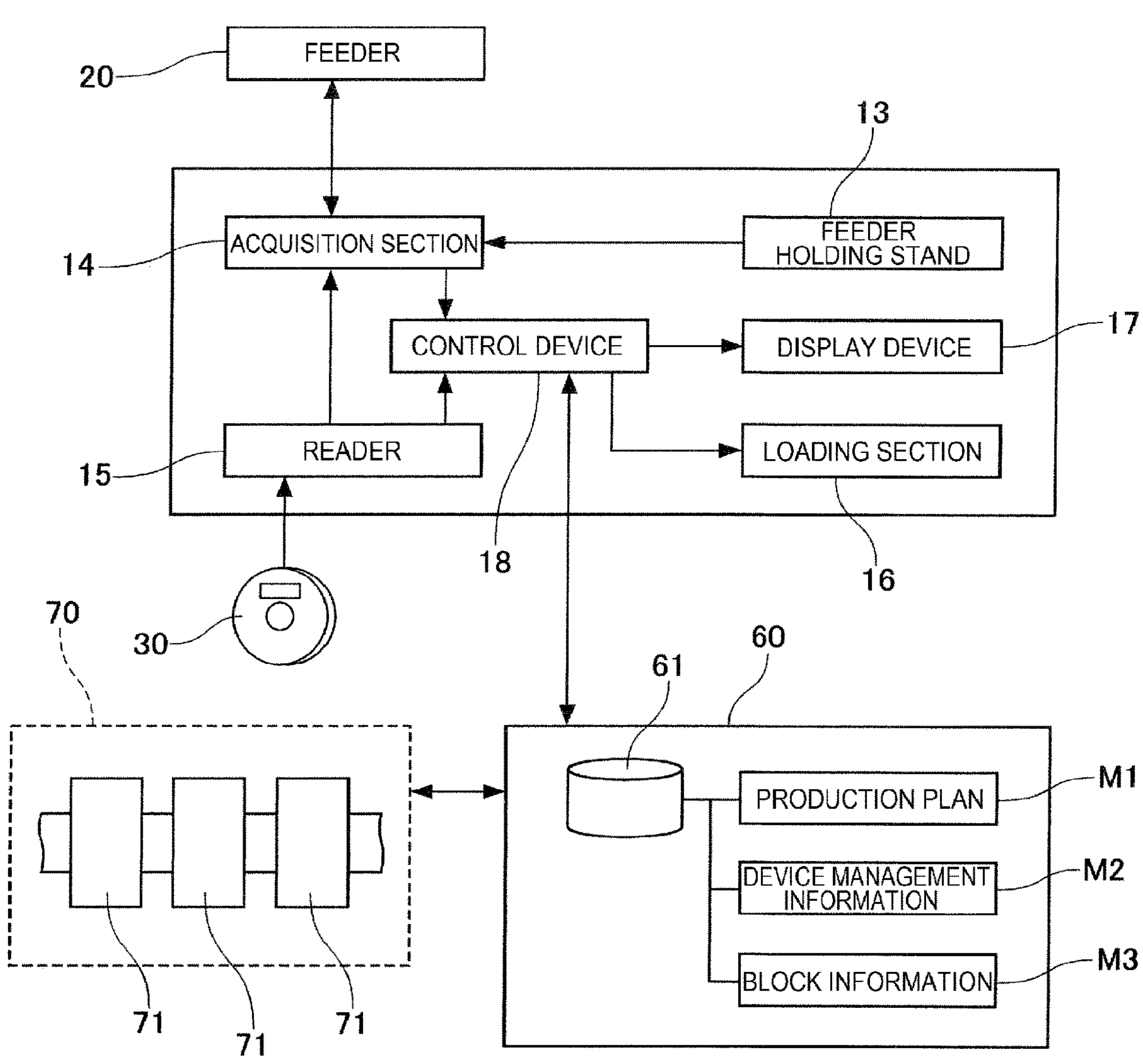
FIG. 4 is a block diagram illustrating functions of the tape loading device.

As illustrated in FIG. 4, tape loading device 10 includes acquisition section 14. Acquisition section 14 acquires identification information (feeder ID) of feeder 20 held in feeder holding stand 13 and identification information (reel ID) of reel 30. In the present embodiment, acquisition section 14 acquires feeder ID by communication with feeder 20 which is in a state of being held in feeder holding stand 13. In addition, acquisition section 14 acquires the reel ID by reading code 31 attached to reel 30.

The reel ID is read by an operation of an operator using reader 15. In a case where reel 30 is accommodated in a predetermined position of tape loading device 10, a reader for automatically reading code 31 with the setting of reel 30 may be provided. Acquisition section 14 sends the feeder ID and the reel ID to control device 18 to be described later at the time of acquiring each of them.

As illustrated in FIG. 3, tape loading device 10 includes loading section 16. Loading section 16 loads carrier tape 40 unwound from reel 30 into feeder 20. In the present embodiment, loading section 16 grips the starting end of tape 40 inserted into tape insertion port 12 by gripping claw 161 in the loading process, and pulls tape 40 to a position corresponding to supply position Ps. Loading section 16 peels off cover tape 42 from base tape 41 by a predetermined length from the starting end of tape 40.

Further, loading section 16 connects the starting end of cover tape 42 to a rear end of a temporary tape (not illustrated) that has been previously routed in a shape along discharge path Te. Finally, loading section 16 delivers tape 40 integrated with the temporary tape to feeder 20 from the side of feeder 20. In this way, loading section 16 is in a state in which base tape 41 is fed and moved from insertion position Pi to supply position Ps in the loading process. In addition, loading section 16 is in a state in which cover tape 42 peeled off from base tape 41 extends along discharge path Te from the peeling position to discharge position Pe via the temporary tape.

As illustrated in FIGS. 1 and 4, tape loading device 10 includes display device 17. Display device 17 is provided above device main body 11 and displays various information so as to be visualized by the operator. Display device 17 displays various notifications by control device 18 to be described later. In addition, display device 17 may include a touch panel capable of receiving an operation by the operator.

As illustrated in FIG. 4, tape loading device 10 includes control device 18. Control device 18 is mainly made up of a CPU, various types of memories, and a control circuit. Control device 18 controls the operation of loading section 16 in the loading process based on information output from acquisition section 14 and various sensors. In addition, control device 18 instructs display device 17 to display various information, and acquires information corresponding to the operation in a case in which display device 17 receives the operation of the operator.

Here, when executing the loading process, a collation operation for collating the feeder ID and the reel ID is executed such that appropriate tape 40 is loaded on feeder 20 to be used in the mounting process. In a conventional tape loading device, after the collation operation is executed by using an external dedicated device, corresponding feeder 20 and reel 30 are set to execute the loading process. The dedicated device for the collation operation is communicably connected to management device 60 which manages feeder 20 and reel 30 with the respective identification information (feeder ID and reel ID).

As illustrated in FIG. 4, management device 60 generally manages production line 70 including board work machine such as tape loading device 10, multiple component mounters 71, or the like. Storage section 61 of management device 60 stores production plan M1, device management information M2, or the like. Production plan M1 is information indicating the type, number, and production order of board products to be produced. Device management information M2 is information indicating feeder 20 and reel 30 assigned to the mounting process, which is executed based on production plan M1 by identification information (feeder ID and reel ID).

When the feeder ID and the reel ID are acquired, management device 60 determines whether the loading of tape 40 into corresponding feeder 20 is permitted based on device management information M2. Then, management device 60 outputs a determination result as to whether the loading is permissible. Here, in a case where tape 40 is loaded as part of the setup change before the mounting process is executed, a large number of feeders 20 and reels 30 are placed around the tape loading device. Therefore, when each of feeder 20 and reel 30 is set in the tape loading device, either the feeder or the reel may be misrecognized.

Tape loading device 10 of the present embodiment can acquire the feeder ID and the reel ID, and can execute the collation operation by directly communicating with management device 60. Then, tape loading device 10 controls the operation of loading section 16 based on the determination result as to whether the loading is permissible acquired from management device 60 as a result of the collation operation. As a result, tape loading device 10 is configured to improve the loading accuracy and the work efficiency.

Specifically, control device 18 is communicably connected to management device 60. Then, in a case in which acquisition section 14 acquires the identification information of each of feeder 20 and reel 30 (the feeder ID and the reel ID), control device 18 sends a pair of identification information to management device 60. Control device 18 acquires a determination result as to whether tape 40 is loadable into feeder 20 by communication from management device 60, and controls the operation of loading section 16 based on the determination result.

In a case in which the loading of tape 40 into feeder 20 is permitted by management device 60, control device 18 causes loading section 16 to execute the loading process. In addition, after the loading process by loading section 16 is completed, control device 18 sends the result of the loading process to management device 60. As a result, in a case in which the loading process is normally completed, it is recorded that predetermined tape 40 is loaded in feeder 20 in management device 60.

In addition, control device 18 locks the operation of at least a part of loading section 16 in a case in which the loading of tape 40 into feeder 20 is not permitted by management device 60. As a result, even if the operator instructs feeder 20 of a combination that is not permitted to load predetermined tape 40, the loading process is stopped by the locking of loading section 16. Control device 18 may unlock loading section 16 in a case in which feeder 20 is removed from feeder holding stand 13 or tape 40 is removed.

After the feeder ID is acquired by acquisition section 14, for example, in a case in which feeder 20 is removed from feeder holding stand 13, control device 18 discards the acquired feeder ID. Similarly, in a configuration in which it is detectable that reel 30 is set, for example, in a case in which reel 30 is removed after the reel ID is acquired by acquisition section 14, control device 18 discards the acquired reel ID. After the determination result as to whether the loading is permissible is already acquired from management device 60, in a case in which at least one of feeder 20 and reel 30 is removed, control device 18 discards the determination result and stops the loading process.

Control device 18 may cause display device 17 to display information associated with the feeder ID and the reel ID related to the collation operation (such as the type of feeder 20, the type and the remaining number of components 51 in tape 40), a determination result as to whether the loading is permissible, or the like. For example, control device 18 notifies the operator of the abnormality in a case in which the loading of tape 40 into feeder 20 is not permitted by management device 60. Here, in a case where management device 60 does not permit the loading of tape 40 into feeder 20, the control device may acquire the information indicating the cause of the non-permission from management device 60 by communication.

Control device 18 may notify the operator of the cause of the non-permission together with the abnormality. As a cause of the non-permission, it is assumed that there is an error in the combination of feeder 20 and reel 30, such as a case in which tape 40 to be loaded into feeder 20 set in tape loading device 10 is not wound on reel 30 that is a target of the collation operation. In addition, it is also regarded as the cause of the non-permission that the feeder ID or the reel ID is not registered in advance in management device 60.

In addition, the loading process may be not permitted based on block information M3. Here, block information M3 is stored in storage section 61 of management device 60. Block information M3 is information for regulating the application of at least one of feeder 20 and reel 30 to the mounting process of component 51 by component mounter 71. For example, when predetermined feeder 20 is in a state of requiring maintenance from the viewpoint of operation accuracy, it is recorded in block information M3 in association with the feeder ID so that the application to the mounting process is regulated until the maintenance is executed.

In addition, when tape 40 to be loaded is in a state in which the use expiration date has been exceeded based on production plan M1 and device management information M2, it is recorded in block information M3 in association with the reel ID so that the application to the mounting process is regulated. Block information M3 is edited so as to cancel the regulation by, for example, executing maintenance on feeder 20. In addition, block information M3 can be arbitrarily set so as to switch the applicability of feeder 20 or reel 30 according to the required accuracy or priority for each mounting process. In a case in which the feeder ID and the reel ID are inputted, management device 60 determines whether tape 40 is loadable into feeder 20 based on block information M3.

5. Loading Process by Tape Loading Device 10

Figure 5:
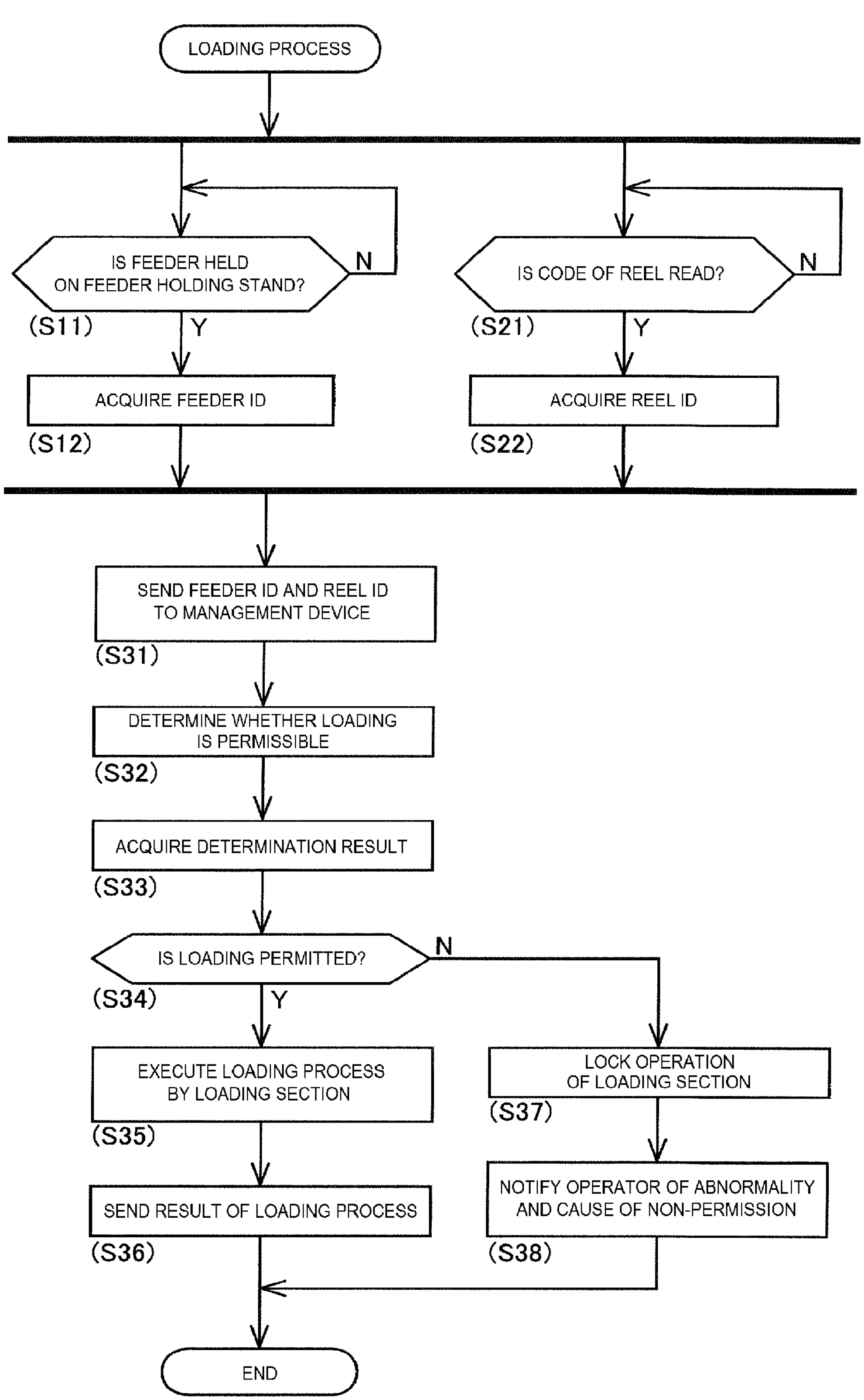
FIG. 5 is a flowchart illustrating a loading process by the tape loading device.

Loading process by tape loading device 10 will be described with reference to FIG. 5. First, in a case in which feeder 20 is held in feeder holding stand 13 (S11: Yes), acquisition section 14 acquires the feeder ID by communication with feeder 20 and sends the feeder ID to control device 18 (S12). Tape loading device 10 maintains a standby state in a case in which feeder 20 is not set (S11: No).

In a case in which the starting end of tape 40 is inserted into tape insertion port 12 and code 31 of reel 30 is read by reader 15 (S21), acquisition section 14 acquires the reel ID from reader 15 and sends the acquired reel ID to control device 18 (S22). Tape loading device 10 executes an acquisition process of the feeder ID and the reel ID in parallel, and maintains the standby state in a case in which code 31 of reel 30 is not read (S21: No).

When acquisition section 14 acquires the pair of feeder ID and reel ID, control device 18 sends them to management device 60 (S31). Management device 60 determines whether the loading is permissible (S32). Specifically, management device 60 determines whether the loading is permissible based on conditions, of which the inputted feeder ID and reel ID are both registered in advance, whether the combination is suitable for the mounting process to be executed, and whether the application to the mounting process is not regulated, are satisfied. Production plan M1, device management information M2, and block information M3 are used for the determination of whether the loading is permissible.

Control device 18 acquires from management device 60 a determination result as to whether reel 30 is loadable into feeder 20 that is currently set (S33). In a case in which the loading is permitted (S34: Yes), control device 18 causes loading section 16 to execute the loading process (S35). After the loading process is executed, control device 18 sends the result of the loading process to management device 60 (S36). As a result, in management device 60, it is recorded that predetermined tape 40 is loaded in feeder 20. In addition, control device 18 may display various types of information on display device 17 so as to notify the operator that the loading process is completed.

In a case in which the loading is not permitted (S34: No), control device 18 locks the operation of at least a part of loading section 16 (S37). Control device 18 notifies the operator of the cause of the non-permission together with the abnormality (S38). As a result, the operator is notified that, for example, feeder 20 or reel 30 is not registered, the combination thereof is not suitable for the mounting process, and at least one of them is blocked. The lock of the operation of loading section 16 is canceled by removing feeder 20 and tape 40.

With such a configuration, tape loading device 10 acquires identification information (feeder ID) of feeder 20 which is a target held by feeder holding stand 13 (S11). Then, the identification information of feeder 20 (feeder ID) and the identification information of reel 30 (reel ID) are sent to management device 60 (S31), and the determination result as to whether the loading is permissible is acquired from management device 60 by communication (S33). 311 to S12, S21 to S22, and S31 to S33 in the loading process correspond to collation operation for collating the feeder ID and the reel ID.

Tape loading device 10 controls the operation of loading section 16 based on the determination result as to whether the loading is permissible (S35 and S37). With such a configuration, since feeder 20, which is an acquisition target of identification information (the feeder ID and the reel ID), is held in feeder holding stand 13, it is possible to prevent another tape 40 from being erroneously loaded into feeder 20 after acquiring the determination result as to whether the loading is permissible from management device 60. As a result, the accuracy of the loading can be improved. In addition, since tape loading device 10 directly communicates with management device 60, it is possible to improve the loading efficiency.

In the present embodiment, since reel 30 is held in reel accommodation section 22 provided in feeder 20 and the starting end of tape 40 is inserted into tape insertion port 12, it is possible to prevent another reel 30 or tape 40 from being erroneously set after acquiring the determination result as to whether the loading is permissible from management device 60.

In addition, even if the starting end of tape 40 is inserted into tape insertion port 12 after the loading is permitted, since feeder 20 has already been set, the operator inserts the starting end of tape 40 of reel 30 that has read code 31 into tape insertion port 12. As a result, it is possible to suppress the erroneous setting of reel 30 and tape 40.

6. Modification Aspect of Embodiment

In the embodiment, feeder 20 which is a loading target of tape loading device 10 is configured to be fed and moved by pulling in tape 40 by feed driving section 23 provided on the front side. Feeder 20 may be an auto loading feeder as described above. Loading section 16 loads tape 40 for each type of feeder 20.

In addition, tape loading device 10 may further include a configuration for opening and closing a cover constituting a side surface of feeder 20, automatically setting feeder 20 and reel 30, and moving the starting end of tape 40 from reel 30 to loading section 16 in the loading process. In either of the configurations, tape loading device 10 executes the collation operation by communicating with management device 60, and controls the operation of loading section 16 based on the result. Accordingly, the same effect as in the embodiment can be obtained.

In the embodiment, tape loading device 10 is configured to send identification information (feeder ID and reel ID) to management device 60, to acquire a determination result as to whether the loading is permissible by management device 60, and to control the operation of loading section 16 based on the determination result. On the other hand, tape loading device 10 may acquire an operation command for instructing the execution of the loading process in addition to the determination result as to whether the loading is permissible from management device 60, and control the operation of loading section 16 based on the operation command. With such a configuration, it is possible to manage the processing including the execution timing of the loading process by management device 60.

REFERENCE SIGNS LIST

10: tape loading device, 13: feeder holding stand, 14: acquisition section, 15: reader, 16: loading section, 18: control device, 20: feeder, Pi: insertion position, Ps: supply position, Pp: peeling position, Pe: discharge position, Te: discharge path, 30: reel, 31: code, 40: carrier tape, 41: base tape, 46: cavity, 42: cover tape, 51: component, 60: management device, 61: storage section, M1: production plan, M2: device management information, M3: block information, 71: component mounter

The invention claimed is:

1. A tape loading device comprising:

a feeder holding stand configured to hold a feeder;

an acquisition section configured to acquire feeder identification information of the feeder held by the feeder holding stand and reel identification information of a reel on which a carrier tape accommodating multiple components is wound;

a loading section configured to load the carrier tape unwound from the reel into the feeder; and a control device configured to be communicably connected to a management device configured to manage each of the feeder with the feeder identification information and the reel with the reel identification information, and to control an operation of the loading section based on a determination result of whether the carrier tape is loadable into the feeder by the management device, the determination result based on a comparison of the feeder identification information, the reel identification information, and a production plan stored in the management device.

2. The tape loading device according to claim 1, wherein the control device sends the feeder identification information and the reel identification information to the management device in a case in which the acquisition section acquires the feeder identification information and the reel identification information.

3. The tape loading device according to claim 1, wherein the control device causes the loading section to execute a loading process in a case in which a loading of the carrier tape into the feeder is permitted by the management device.

4. The tape loading device according to claim 3, wherein the control device sends a result of the loading process to the management device after the loading process by the loading section is completed.

5. The tape loading device according to claim 1, wherein the control device locks an operation of at least a part of the loading section in a case in which a loading of the carrier tape into the feeder is not permitted by the management device.

6. The tape loading device according to claim 5, wherein the control device unlocks the loading section in a case in which the feeder is removed from the feeder holding stand or the reel is removed.

7. The tape loading device according to claim 1, wherein the control device notifies an operator of an abnormality in a case in which a loading of the carrier tape into the feeder is not permitted by the management device.

8. The tape loading device according to claim 7, wherein, in a case in which the loading of the carrier tape into the feeder is not permitted by the management device, the control device acquires information indicating a cause of non-permission from the management device, and notifies the operator of the cause of the non-permission together with the abnormality.

9. The tape loading device according to claim 1, wherein the management device manages, for at least one of the feeder or the reel, block information for regulating an application of the components to a mounting process by a component mounter in association with at least one of the feeder identification information or the reel identification information, and determines whether the carrier tape is loadable into the feeder based on the block information.

10. The tape loading device according to claim 1, wherein the acquisition section acquires the feeder identification information of the feeder by communicating with the feeder which is in a state of being held by the feeder holding stand, and acquires the reel identification information of the reel by reading a code attached to the reel.

11. The tape loading device according to claim 1, wherein the carrier tape has a base tape in which cavities respectively accommodating the components are formed at equal intervals in a longitudinal direction, and a cover tape bonded to the base tape to close the cavities, in a process of supplying the component accommodated in the loaded carrier tape at a supply position, the feeder feeds and moves the carrier tape unwound from the reel from an insertion position to the supply position, and peels the cover tape from the base tape such that the cavities are opened at the supply position and feeds and moves the cover tape along a predetermined discharge path to a discharge position, and in a loading process of loading the carrier tape into the feeder, the loading section is in a state in which the base tape is fed and moved from the insertion position to the supply position, and the cover tape peeled from the base tape is extended along the discharge path from a peeling position to the discharge position.

* * * * *